(12) United States Patent
Cho et al.

(10) Patent No.: US 8,048,324 B2
(45) Date of Patent: Nov. 1, 2011

(54) METHOD OF MANUFACTURING OPTICAL WAVEGUIDE AND METHOD OF MANUFACTURING PACKAGE BOARD

(75) Inventors: Han-Seo Cho, Daejeon (KR); Je-Gwang Yoo, Yongin-si (KR); Sang-Hoon Kim, Gunpo-si (KR); Joon-Sung Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 898 days.

(21) Appl. No.: 12/076,359

(22) Filed: Mar. 17, 2008

(65) Prior Publication Data

US 2009/0072419 A1 Mar. 19, 2009

(30) Foreign Application Priority Data

Sep. 13, 2007 (KR) ........................ 10-2007-0092931

(51) Int. Cl.
*G02B 6/10* (2006.01)
(52) U.S. Cl. ........................................ 216/24; 264/1.24
(58) Field of Classification Search ........................ None
See application file for complete search history.

(56) References Cited

U.S. PATENT DOCUMENTS

| 6,166,372 | A  | * | 12/2000 | Yamamoto et al. | 250/225 |
| 6,480,639 | B2 | * | 11/2002 | Hashimoto et al. | 385/14 |
| 6,504,966 | B2 | * | 1/2003 | Kato et al. | 385/16 |
| 7,095,928 | B2 | * | 8/2006 | Blauvelt et al. | 385/49 |
| 2002/0001427 | A1 | * | 1/2002 | Hashimoto et al. | 385/14 |
| 2002/0097962 | A1 | * | 7/2002 | Yoshimura et al. | 385/50 |
| 2002/0114556 | A1 | * | 8/2002 | Kato et al. | 385/16 |
| 2004/0218849 | A1 | * | 11/2004 | Blauvelt et al. | 385/14 |

* cited by examiner

*Primary Examiner* — Allan Olsen

(57) ABSTRACT

A method of manufacturing an optical waveguide includes: forming a first reflective bump and a second reflective bump, which have inclined surfaces formed on sides opposite to each other and which are disposed with a predetermined distance in-between, on an upper side of a conductive carrier; polishing the surfaces of the first reflective bump and the second reflective bump; forming a core between the first reflective bump and the second reflective bump; stacking an upper cladding over the upper side of the carrier to cover the first reflective bump, the second reflective bump, and the core; removing the carrier; and stacking a lower cladding over a lower side of the upper cladding. Forming reflective bumps on a conductive carrier, and polishing the reflective bumps to form inclined surfaces, can reduce lead time and can provide a high degree of freedom in design.

11 Claims, 18 Drawing Sheets

METHOD OF MANUFACTURING OPTICAL WAVEGUIDE AND METHOD OF MANUFACTURING PACKAGE BOARD

CROSS-REFERENCE TO RELATED APPLICATIONS

This application claims the benefit of Korean Patent Application No. 10-2007-0092931 filed with the Korean Intellectual Property Office on Sep. 13, 2007, the disclosure of which is incorporated herein by reference in its entirety.

BACKGROUND OF THE INVENTION

1. Technical Field

The present invention relates to a method of manufacturing an optical waveguide and a method of manufacturing a package board.

2. Description of the Related Art

With the recent developments in computers and communication technology, the transfer speed of signals has become an important parameter. Accordingly, impedance matching between the components and the wiring is becoming important in a high-frequency package board.

The package board used a conductive metal such as copper, etc., for the electrical wiring, as a medium for the transfer of signals, there was a limit to transmitting data at ultra-high speeds and in high capacities. As a method of overcoming this problem, the optical package board was developed, in which an optical waveguide of a particular size is formed directly in a silicon substrate, which is then mounted on a package board.

That is, in the past, the method used in manufacturing a package board included forming circuit patterns on a copper plate to form the inner and outer layers of a package board, but recently, the method is being used of inserting in the package board an optical waveguide, which is capable of exchanging signals by light using polymers and glass fibers.

Here, an optical waveguide refers to a means for transmitting optical signals that consists of a center portion having a high refractive index, known as the core, and a surrounding portion having a low refractive index, known as the cladding. When an optical signal enters such an optical waveguide, the incident optical signal undergoes repeated total reflection at the boundary between the core and cladding, which allows the optical signal to travel through the core.

The materials for optical fibers include glass fibers and plastic fibers, where glass fibers can be subdivided into quartz type glass fibers and multi-element glass fibers. For communication uses, quartz type glass fibers are mainly used, which provide lower losses, while plastic fibers are commonly used for transmitting light energy, as lighting devices or decorations.

A typical manufacturing method for an optical waveguide includes the stacking-type method, in which the core is formed over a lower cladding layer, after which the core is processed to form an inclined surface, and then an upper cladding layer is formed.

With this method, however, a separate dicing process may be required, in order to form the inclined surface which alters the paths of optical signals. Moreover, in cases where several inclined surfaces are to be formed, the dicing process may be repeated a corresponding number of times, greatly degrading production efficiency.

SUMMARY OF THE INVENTION

With the recent developments in computers and communication technology, the transfer speed of signals has become an important parameter. Accordingly, impedance matching between the components and the wiring is becoming important in a high-frequency package board.

The package board used a conductive metal such as copper, etc., for the electrical wiring, as a medium for the transfer of signals, there was a limit to transmitting data at ultra-high speeds and in high capacities. As a method of overcoming this problem, the optical package board was developed, in which an optical waveguide of a particular size is formed directly in a silicon substrate, which is then mounted on a package board.

That is, in the past, the method used in manufacturing a package board included forming circuit patterns on a copper plate to form the inner and outer layers of a package board, but recently, the method is being used of inserting in the package board an optical waveguide, which is capable of exchanging signals by light using polymers and glass fibers.

Here, an optical waveguide refers to a means for transmitting optical signals that consists of a center portion having a high refractive index, known as the core, and a surrounding portion having a low refractive index, known as the cladding. When an optical signal enters such an optical waveguide, the incident optical signal undergoes repeated total reflection at the boundary between the core and cladding, which allows the optical signal to travel through the core.

The materials for optical fibers include glass fibers and plastic fibers, where glass fibers can be subdivided into quartz type glass fibers and multi-element glass fibers. For communication uses, quartz type glass fibers are mainly used, which provide lower losses, while plastic fibers are commonly used for transmitting light energy, as lighting devices or decorations.

A typical manufacturing method for an optical waveguide includes the stacking-type method, in which the core is formed over a lower cladding layer, after which the core is processed to form an inclined surface, and then an upper cladding layer is formed.

With this method, however, a separate dicing process may be required, in order to form the inclined surface which alters the paths of optical signals. Moreover, in cases where several inclined surfaces are to be formed, the dicing process may be repeated a corresponding number of times, greatly degrading production efficiency ice of the invention.

DETAILED DESCRIPTION OF THE PREFERRED EMBODIMENTS

Figure 1:
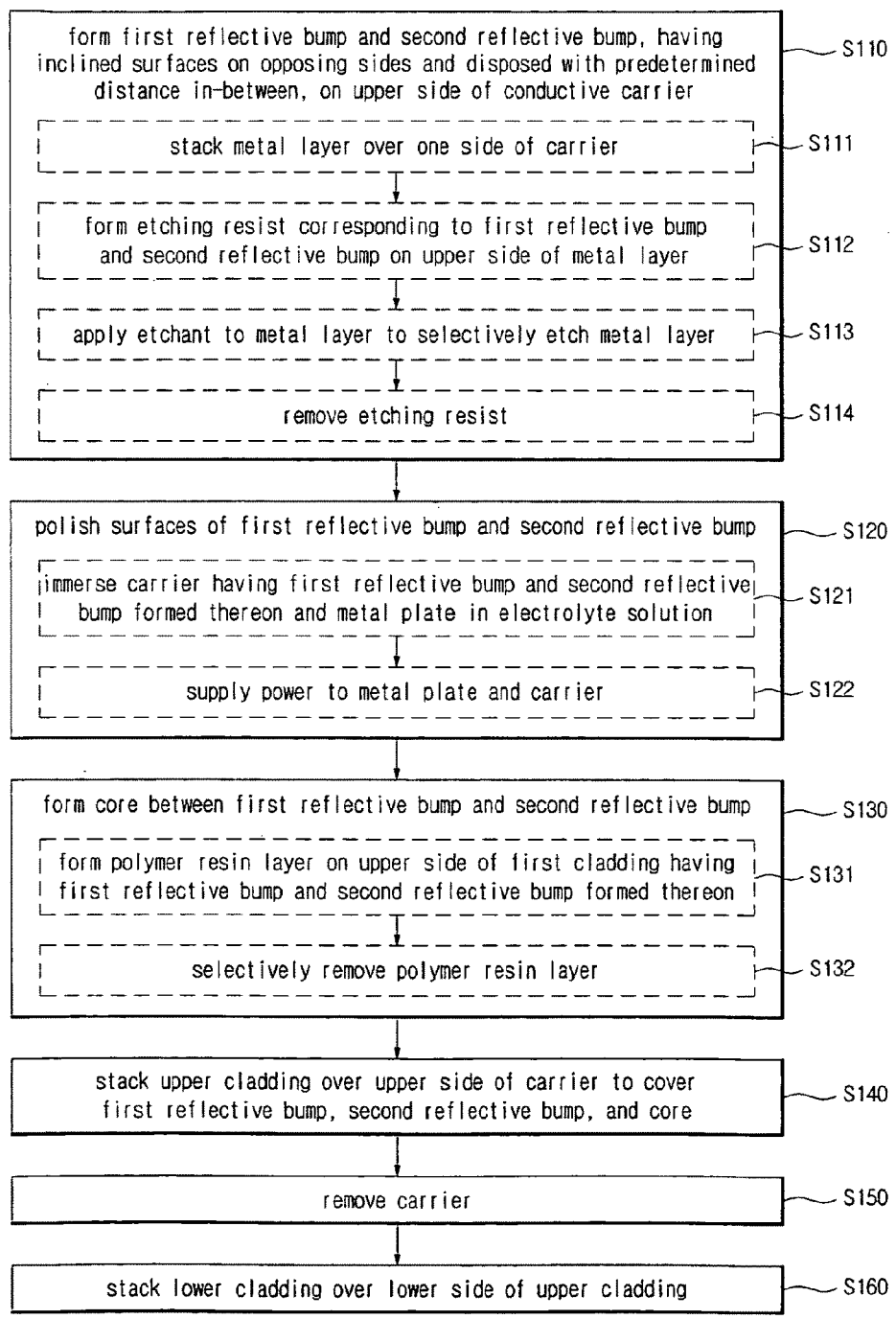
FIG. 1 is a flowchart illustrating an embodiment of a method of manufacturing an optical waveguide according to an aspect of the present invention.

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The method of manufacturing an optical waveguide and method of manufacturing a package board according to certain embodiments of the invention will be described below in more detail with reference to the accompanying drawings. Those components that are the same or are in correspondence are rendered the same reference numeral regardless of the figure number, and redundant explanations are omitted.

FIG. 1 is a flowchart illustrating an embodiment of a method of manufacturing an optical waveguide according to an aspect of the present invention, and FIG. 2 to FIG. 12 are cross-sectional views representing a process diagram for the method of manufacturing an optical waveguide illustrated in FIG. 1. In FIGS. 2 to 12, there are illustrated a metal layer 10, first reflective bumps 12, inclined surfaces 12a, 14a, second reflective bumps 14, a carrier 20, an etching resist 30, a core 40, a polymer resin layer 42, an upper cladding 51, a lower cladding 52, an electrolyte bath 61, an electrolyte solution 62, and a metal plate 63.

First, on the upper side of a conductive carrier 20, a first reflective bump 12 and a second reflective bump 14 are formed, which have inclined surfaces 12a, 14a formed on opposing sides, and which are disposed with a predetermined distance in-between (S110). A more detailed description for this process will be provided as follows.

Figure 2:
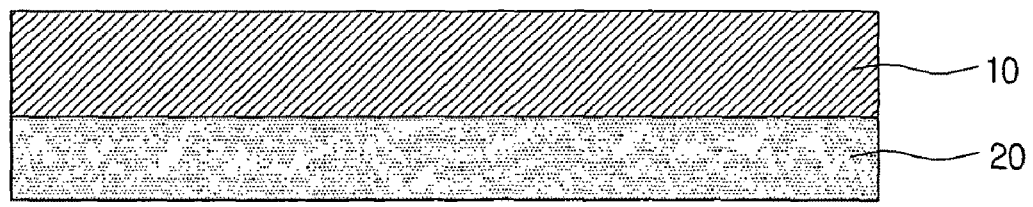
FIG. 2, FIG. 3, FIG. 4, FIG. 5, FIG. 6, FIG. 7, FIG. 8, FIG. 9, FIG. 10, FIG. 11, and FIG. 12 are cross-sectional views collectively representing a process diagram that illustrates the method of manufacturing an optical waveguide in FIG. 1.

First, a metal layer 10 may be stacked on the upper side of the carrier 20 (S111). An example of a metal layer 10 stacked over a carrier 20 is illustrated in FIG. 2. Of course, the carrier 20 may be such that has a metal layer 10 stacked on beforehand.

Figure 3:
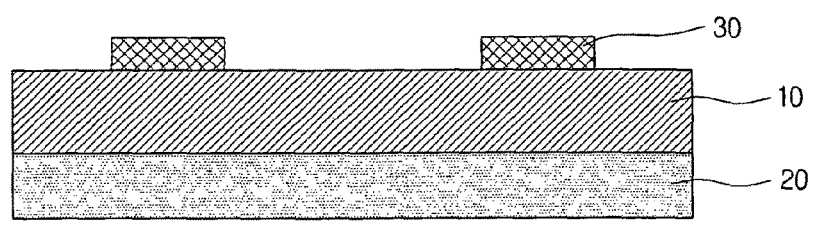

Next, on an upper side of the metal layer 10, an etching resist 30 may be formed which corresponds with the first reflective bump 12 and the second reflective bump 14 (S112). This may be achieved by performing exposure on the upper side of the metal layer 10 using a photosensitive film (not shown) and a mask (not shown). An example of a metal layer 10 with an etching resist 30 formed in such manner is illustrated in FIG. 3.

Figure 4:
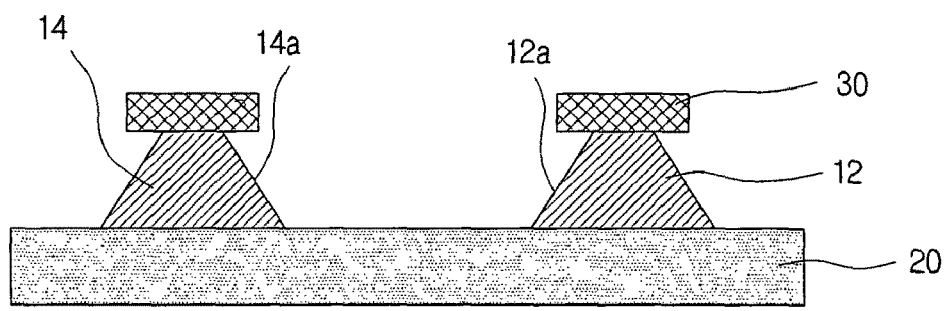

Next, an etchant may be applied to the metal layer 10 to selectively etch the metal layer 10 (S113), as illustrated in FIG. 4, and then the etching resist 30 may be removed (S114). The configuration after the etching resist 30 is removed is illustrated in FIG. 5.

To be more specific, by providing an etchant on the metal layer 10 having an etching resist 30 formed on the upper surface, the portions other than those covered by the etching resist 30 may be etched. After this process, the portions covered by the etching resist 30 can be made to have the shape of bumps, with inclined surfaces 12a, 14a formed on the sides. In this embodiment, these will be referred to as reflective bumps.

Figure 5:
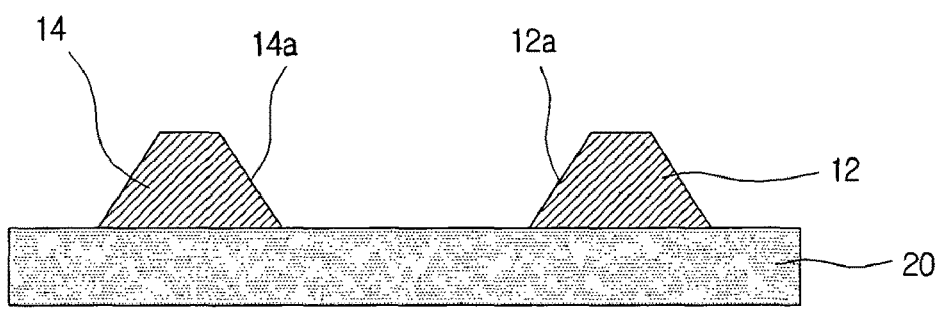

In FIG. 5, multiple reflective bumps are shown. To distinguish between these, in this embodiment, a reflective bump positioned on the right will be referred to as a first reflective bump 12, while a reflective bump positioned on the right will be referred to as a second reflective bump 14.

Next, a process of polishing the surfaces of the first reflective bump 12 and second reflective bump 14 may be performed (S120). As the surfaces of the first reflective bump 12 and second reflective bump 14 may serve to alter the paths of optical signals, polishing the surfaces can prevent the optical signals from being dispersed.

For this, a method such as electropolishing may be used. That is, the carrier 20, on which the first reflective bump 12 and the second reflective bump 14 are formed, and a metal plate 63 may each be immersed in an electrolyte solution 62 (S121), after which power may be supplied to the metal plate 63 and the carrier 20 (S122).

Figure 6:
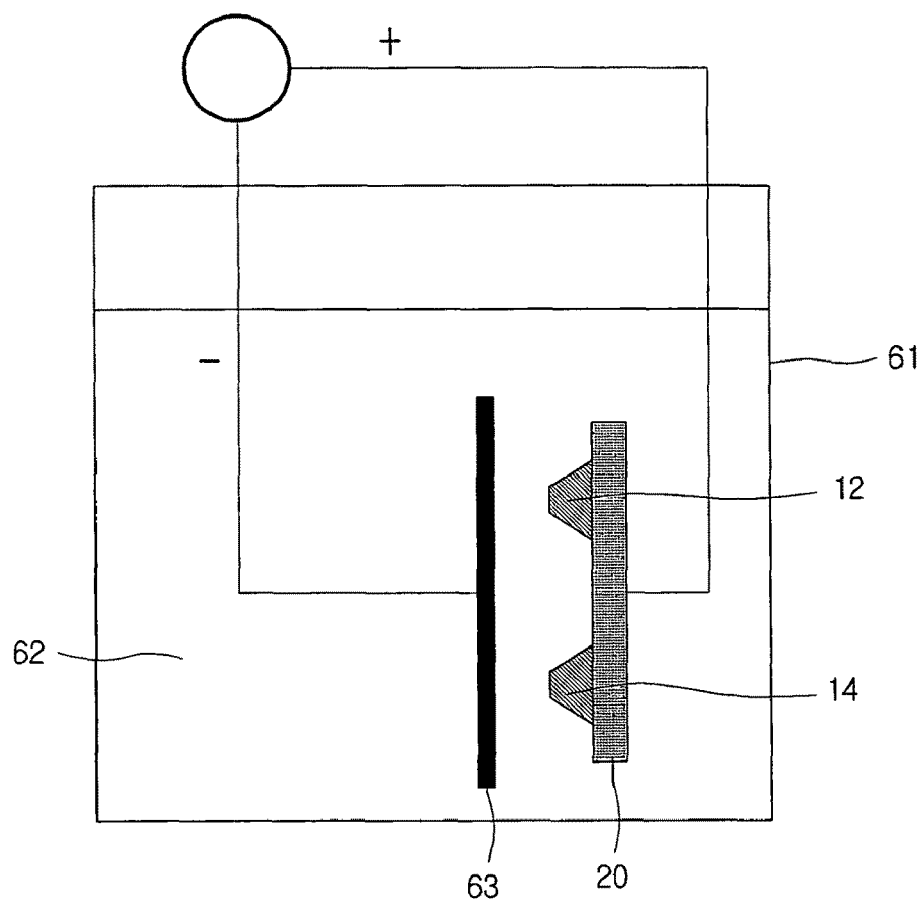

FIG. 6 is a diagram of an example mode of performing electropolishing, which illustrates an electrolyte bath 61 containing an electrolyte solution 62 and a metal plate 63, etc., used in the electropolishing. A sulfuric acid solution of a low concentration can be used for the electrolyte, while platinum (Pt) can be used for the metal plate 63. Of course, other materials can also be used.

Supplying power to the carrier 20, which is electrically conductive, makes it possible to supply power to all of the reflective bumps 12, 14 connected with the carrier 20, so that the electropolishing may be facilitated for each of the reflective bumps 12, 14.

Next, a core 40 may be formed between the first reflective bump 12 and the second reflective bump 14 (S130). The core 40 may serve as a channel through which optical signals may travel. A more detailed description will be will be provided as follows, with regard to a method of forming the core 40.

Figure 7:
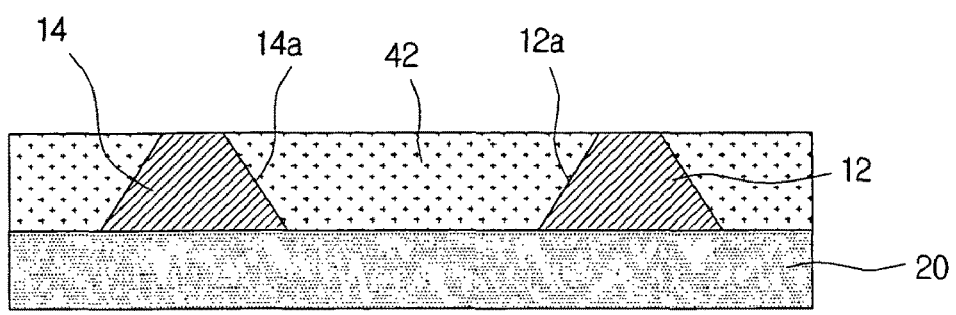

First, a polymer resin layer 42 may be formed on the upper side of the carrier 20, where the first reflective bump 12 and the second reflective bump 14 are formed (S131). A method used for this may be to stack a polymer film, such as a polyimide film, on the upper surface of the first cladding 20. A polymer resin layer 42 formed on the upper surface of the first cladding 20 in this manner is illustrated in FIG. 7.

Figure 8:
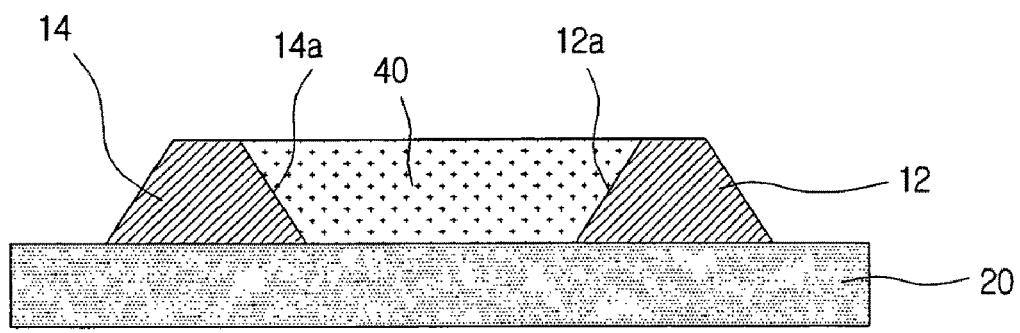
Figure 9:
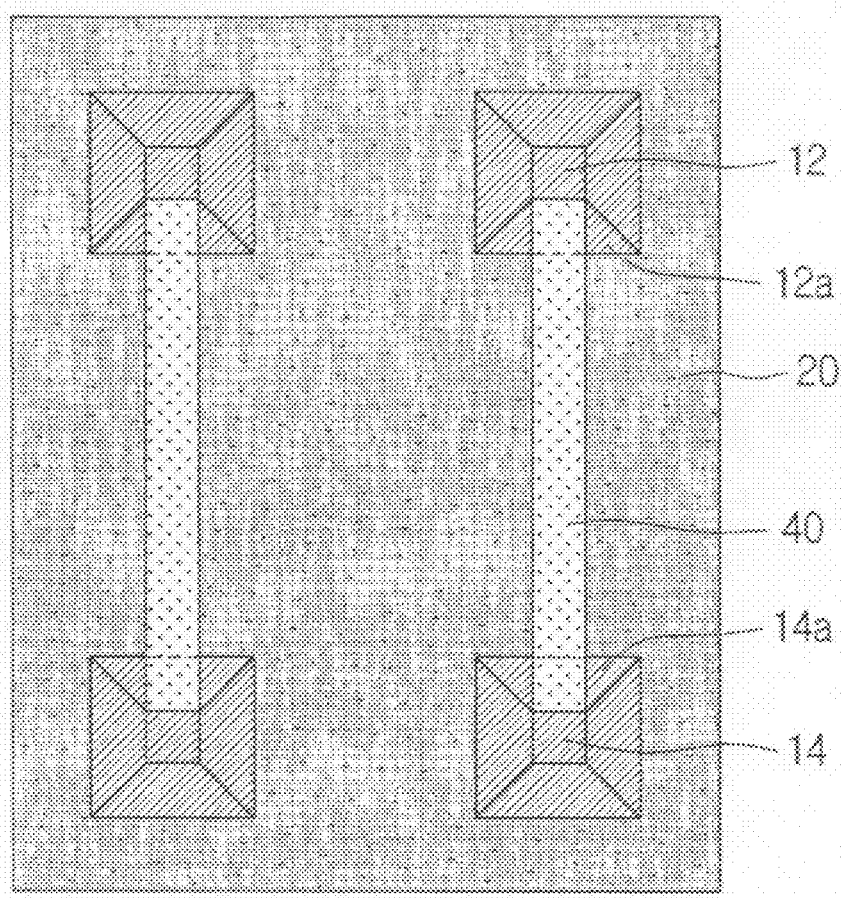
Figure 10:
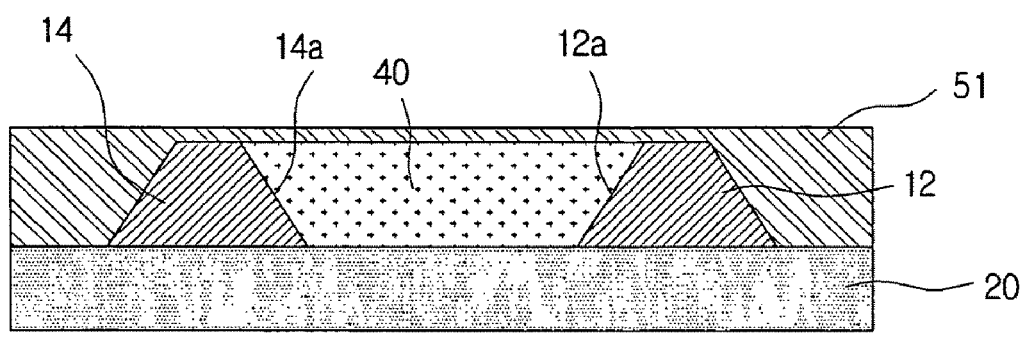

Next, the polymer resin layer 42 may be selectively removed (S132). The portions excluding the portions where the core 40 will be formed are removed, so that a core 40 may be formed between the first reflective bump 12 and the second reflective bump 14. A core 40 formed in this manner is illustrated in FIGS. 8 and 9.

Figure 11:
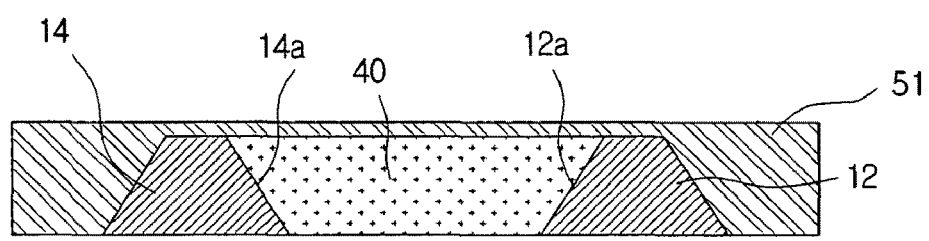
Figure 12:
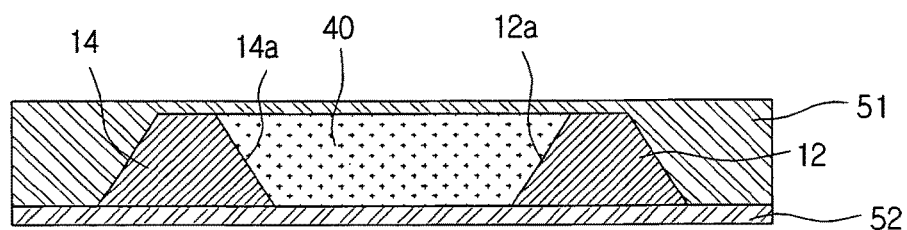

After forming the core 40, an upper cladding 51 may be stacked over the upper side of the carrier 20, to cover the first reflective bump 12, second reflective bump 14, and core 40 (S140). Then, the carrier 20 may be removed (S150), as illustrated in FIG. 11, and a lower cladding 52 may be stacked on the lower side of the upper cladding 51 (S160) as illustrated in FIG. 12. In this way, the core 40 may be covered by the upper cladding 51 and the lower cladding 52.

The removal of the carrier 20 can be effected using wet etching. The carrier 20 may efficiently be removed by applying an etchant to the carrier 20. Here, in order that the first reflective bump 12 and second reflective bump 14 may not be damaged by the etchant, the carrier 20 can be made from a material different from those of the first and second reflective bumps 12, 14. That is, they can be made from materials that react to different types of etchant. For example, the carrier 20 can be made from nickel (Ni) or aluminum (Al), while the first reflective bump 12 and the second reflective bump 14 can be made from copper (Cu). Of course, this is merely an example, and it is apparent that other materials can also be used.

Figure 13:
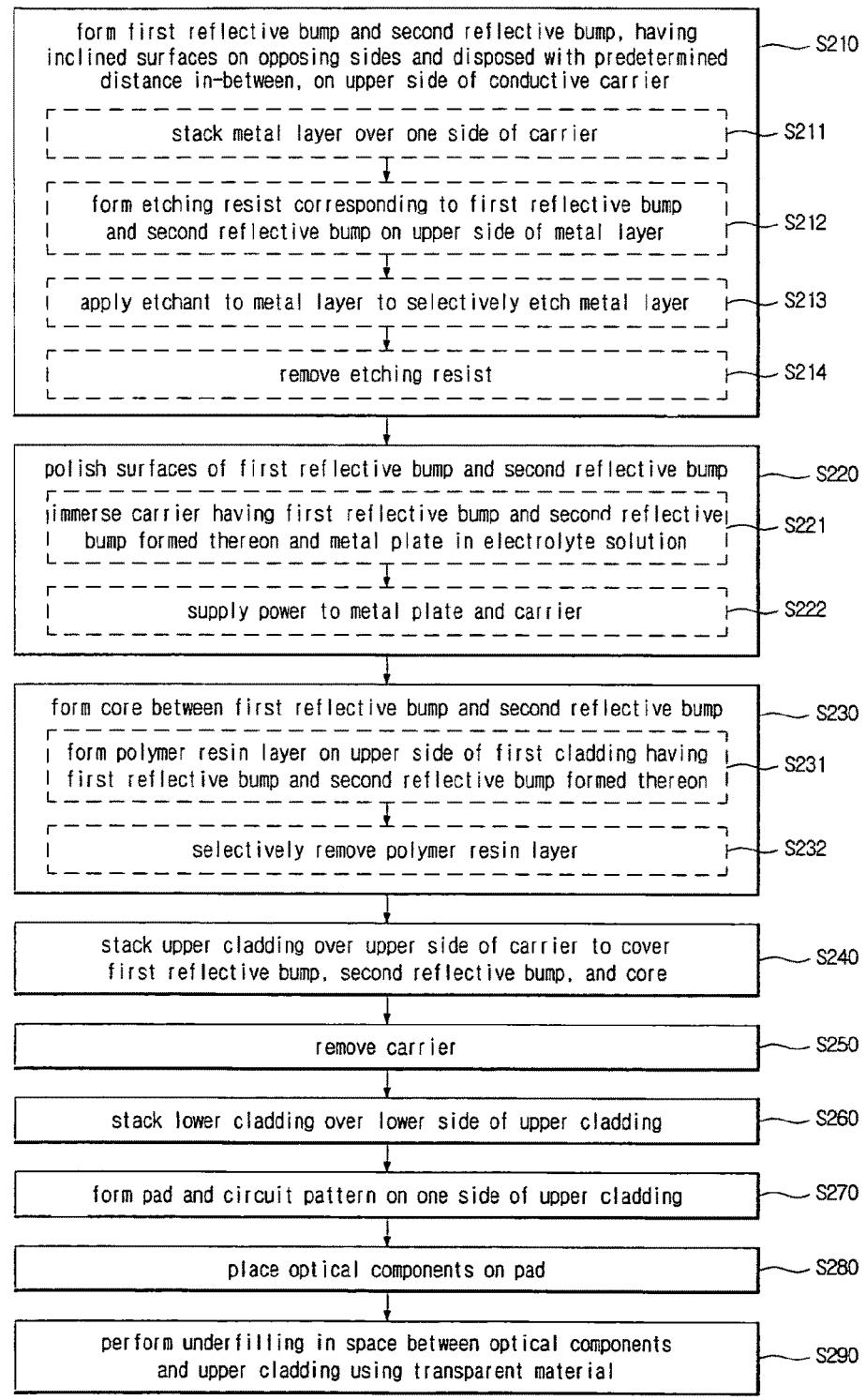
FIG. 13 is a flowchart illustrating an embodiment of a method of manufacturing a package board according to another aspect of the present invention.
Figure 14:
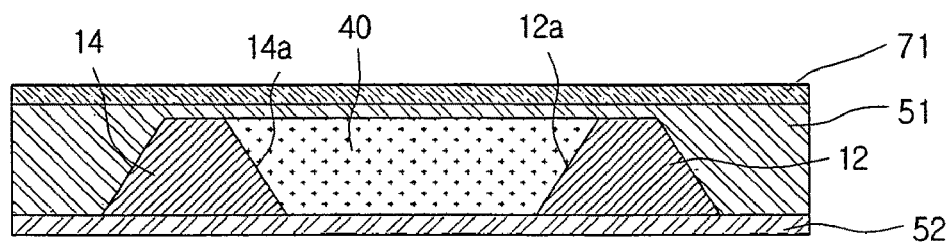
FIG. 14, FIG. 15, FIG. 16, FIG. 17, and FIG. 18 are cross-sectional views collectively representing a process diagram that illustrates the method of manufacturing a package board in FIG. 13.

Next, a manufacturing method for a package board according to another aspect of the invention will be described as follows. FIG. 13 is a flowchart illustrating an embodiment of a method of manufacturing a package board according to another aspect of the present invention, and FIG. 14 to FIG. 18 are cross-sectional views representing a process diagram for the method of manufacturing a package board illustrated in FIG. 13. In FIG. 14, there are illustrated a first reflective bump 12, inclined surfaces 12a, 14a, a second reflective bump 14, a core 40, an upper cladding 51, a lower cladding 52, a metal layer 71, pads 72, a solder resist 73, optical components 74a, 74b, and underfill 75.

The method of manufacturing a package board according to this embodiment may utilize the manufacturing method for an optical waveguide disclosed above. This embodiment presents a manufacturing method for a package board, in which optical components 74a, 74b may be mounted on the optical waveguide described above, and circuit patterns may be formed, to manufacture the package board. As such, the following will refer also to FIGS. 2 to 12, and descriptions will not be provided again in much detail for processes that are substantially the same as those that have been already been disclosed in describing the manufacturing method for an optical waveguide.

First, a first reflective bump 12 and a second reflective bump 14 may be formed on an upper side of a conductive carrier (S210), where the first reflective bump 12 and second reflective bump 14 have inclined surfaces 12a, 14a formed on opposite sides facing each other, and where a predetermined distance separates the first reflective bump 12 and second reflective bump 14. To this end, a metal layer 10 may be stacked on the one side of the first cladding 20 (S211), and an etching resist 30 corresponding to the first reflective bump 12 and second reflective bump 14 may be formed on one side of the metal layer 10 (S212). Then, an etchant may be applied to the metal layer 10 to selectively etch the metal layer 10 (S213), and then the etching resist 30 may be removed (S214).

Next, the surfaces of the first reflective bump 12 and the second reflective bump 14 may be polished (S220). For this, the carrier 20, on which the first reflective bump 12 and the second reflective bump 14 are formed, and a metal plate 63 may be immersed in an electrolyte solution 62 (S221), after which power may be supplied to the metal plate 63 and the carrier 20 (S222).

Then, a core 40 may be formed between the first reflective bump 12 and the second reflective bump 14 (S230). To this end, a polymer resin layer 42 may be formed on the upper side of the carrier 20, where the first reflective bump 12 and the second reflective bump 14 are formed (S231), and the polymer resin layer 42 may be selectively removed (S232).

After forming the core 40, an upper cladding 51 may be stacked over the upper side of the carrier 20, to cover the first reflective bump 12, second reflective bump 14, and core 40 (S240), and then the carrier 20 may be removed (S250), after which a lower cladding 52 may be stacked on the lower side of the upper cladding 51 (S260). In this way, the core 40 may be covered by the upper cladding 51 and the lower cladding 52.

The removal of the carrier 20 can be performed using wet etching. Here, in order that the first reflective bump 12 and second reflective bump 14 may not be damaged by the etchant, the carrier 20 can be made from a material different from those of the first and second reflective bumps 12, 14, as already described above.

Figure 15:
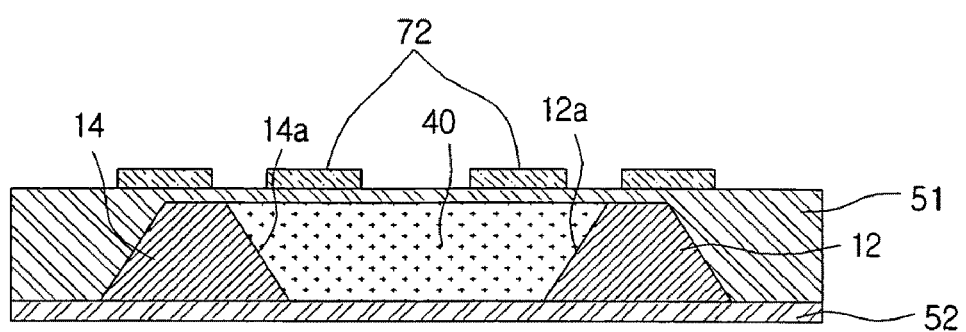
Figure 16:
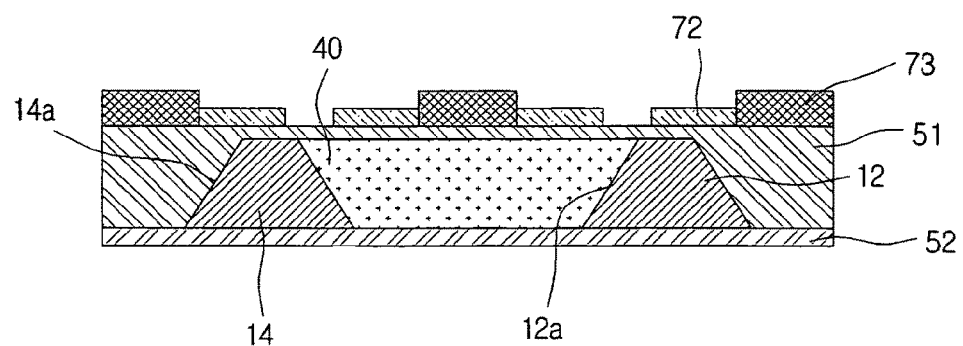

Next, pads 72 and a circuit pattern (not shown) may be formed on one side of the upper cladding 51 (S270). This can include stacking a metal layer 71 on the upper side of the upper cladding 51, as illustrated in FIG. 14, selectively etching the metal layer 71 to form the pads 72 and the circuit pattern (not shown), as illustrated in FIG. 15, and forming a solder resist 73, as illustrated in FIG. 16. Here, the pads 72 can be exposed, to allow the mounting of optical components 74a, 74b.

Figure 17:
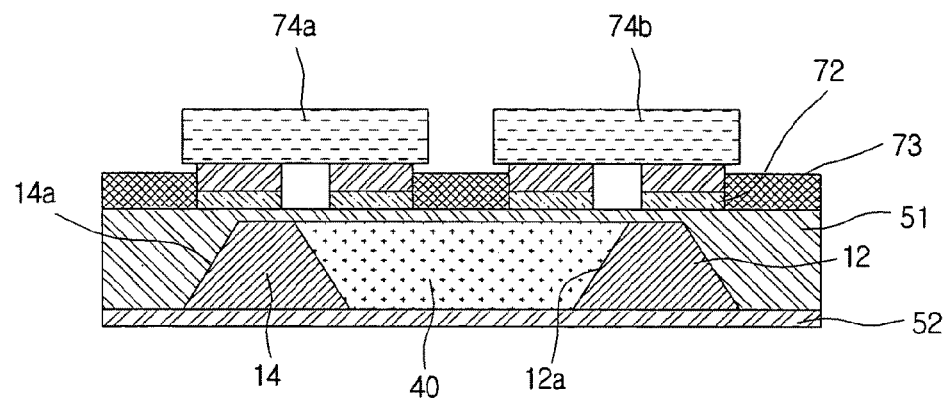
Figure 18:
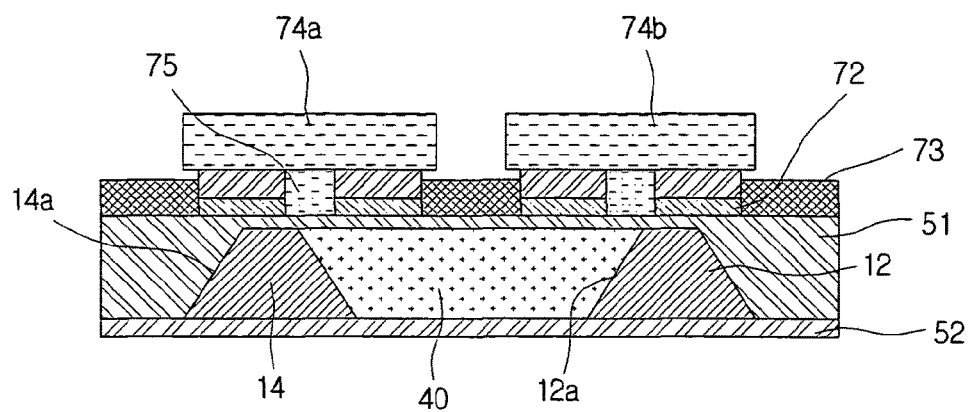

Next, as illustrated in FIG. 17, optical components 74a, 74b may be placed on the pads 72 (S280), and as illustrated in FIG. 18, underfilling may be performed in the space between the optical components 74a, 74b and the upper cladding 51, using a transparent material (S290). By forming the underfill 75 in the space between the optical components 74a, 74b and the upper cladding 51, the optical components 74a, 74b can be mounted securely on the optical waveguide. The position where the underfill 75 is formed may be located in the path through which the optical signals travel, so the underfill 75 can be made of a transparent material, in order that no obstructions occur in the transmission of optical signals.

According to certain embodiments of the invention as set forth above, reflective bumps may be formed on a conductive carrier, and the reflective bumps may be polished to form inclined surfaces, making it possible to reduce lead time and enable a high degree of freedom in design.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above are encompassed within the scope of claims of the present invention.

What is claimed is:

1. A method of manufacturing an optical waveguide, the method comprising:
    forming a first reflective bump and a second reflective bump on an upper side of a conductive carrier, the first reflective bump and the second reflective bump each having an inclined surface formed thereon and disposed with a predetermined distance in-between, the inclined surfaces formed on opposing sides of the first reflective bump and the second reflective bump respectively;
    polishing surfaces of the first reflective bump and the second reflective bump;
    forming a core between the first reflective bump and the second reflective bump;
    stacking an upper cladding over the upper side of the carrier such that the upper cladding covers the first reflective bump, the second reflective bump, and the core;
    removing the carrier; and
    stacking a lower cladding over a lower side of the upper cladding.

2. The method of claim 1, wherein the carrier is made from a material different from materials of the first reflective bump and the second reflective bump.

3. The method of claim 1, wherein forming the first reflective bump and the second reflective bump comprises:
    stacking a metal layer on the upper side of the carrier;

forming an etching resist corresponding to the first reflective bump and the second reflective bump over an upper side of the metal layer;
selectively etching the metal layer by applying an etchant to the metal layer; and
removing the etching resist.

4. The method of claim 1, wherein forming the core comprises:
forming a polymer resin layer on the upper side of the carrier having the first reflective bump and the second reflective bump formed thereon; and
selectively removing the polymer resin layer.

5. The method of claim 1, wherein polishing the surfaces of the first reflective bump and the second reflective bump comprises:
immersing the carrier and a metal plate respectively in an electrolyte solution, the carrier having the first reflective bump and the second reflective bump formed thereon; and
supplying power to the metal plate and the carrier.

6. A method of manufacturing a package board, the method comprising:
forming a first reflective bump and a second reflective bump on an upper side of a conductive carrier, the first reflective bump and the second reflective bump each having an inclined surface formed thereon and disposed with a predetermined distance in-between, the inclined surfaces formed on opposing sides of the first reflective bump and the second reflective bump respectively;
polishing surfaces of the first reflective bump and the second reflective bump;
forming a core between the first reflective bump and the second reflective bump;
stacking an upper cladding over the upper side of the carrier such that the upper cladding covers the first reflective bump, the second reflective bump, and the core;
removing the carrier;
stacking a lower cladding over a lower side of the upper cladding;
forming a pad and a first circuit pattern on one side of the upper cladding; and
mounting an optical component on the pad.

7. The method of claim 6, wherein the carrier is made from a material different from materials of the first reflective bump and the second reflective bump.

8. The method of claim 6, wherein forming the first reflective bump and the second reflective bump comprises:
stacking a metal layer on the upper side of the carrier;
forming an etching resist corresponding to the first reflective bump and the second reflective bump over an upper side of the metal layer;
selectively etching the metal layer by applying an etchant to the metal layer; and
removing the etching resist.

9. The method of claim 6, wherein forming the core comprises:
forming a polymer resin layer on the upper side of the carrier having the first reflective bump and the second reflective bump formed thereon; and
selectively removing the polymer resin layer.

10. The method of claim 6, wherein polishing the surfaces of the first reflective bump and the second reflective bump comprises:
immersing the carrier and a metal plate respectively in an electrolyte solution, the carrier having the first reflective bump and the second reflective bump formed thereon; and
supplying power to the metal plate and the carrier.

11. The method of claim 6, further comprising:
performing underfilling using a transparent material in a space between the optical component and the upper cladding.

* * * * *